United States Patent
Ballagh et al.

(10) Patent No.: US 7,184,946 B2
(45) Date of Patent: Feb. 27, 2007

(54) CO-SIMULATION VIA BOUNDARY SCAN INTERFACE

(75) Inventors: Jonathan B. Ballagh, Longmont, CO (US); Nabeel Shirazi, San Jose, CA (US); Christopher N. Battson, San Francisco, CA (US); Michael E. Darnall, Campbell, CA (US); Bradley K. Fross, Claremont, CA (US)

(73) Assignee: Xilinx, Inc., San Jose, CA (US)

( * ) Notice: Subject to any disclaimer, the term of this patent is extended or adjusted under 35 U.S.C. 154(b) by 657 days.

(21) Appl. No.: 10/600,885

(22) Filed: Jun. 19, 2003

(65) Prior Publication Data

US 2004/0260528 A1   Dec. 23, 2004

(51) Int. Cl.
G06F 9/455 (2006.01)

(52) U.S. Cl. .............. 703/23; 703/27; 703/28; 703/22; 703/14; 716/1; 716/8; 717/135

(58) Field of Classification Search .......... 703/27, 703/22, 14, 28, 21, 23; 716/1, 8; 326/93; 717/135, 136; 370/466; 713/157
See application file for complete search history.

(56) References Cited

U.S. PATENT DOCUMENTS

| 6,449,284 | B1* | 9/2002 | Hagirahim ............ 370/466 |
| 6,850,092 | B2* | 2/2005 | Chelcea et al. ............ 326/93 |
| 6,907,584 | B1* | 6/2005 | Milne et al. ............ 716/1 |
| 6,937,973 | B1* | 8/2005 | Panesar ............ 703/21 |
| 7,085,706 | B1 | 8/2006 | McGettigan et al. |
| 2002/0083420 | A1* | 6/2002 | Zammit et al. ............ 717/135 |
| 2002/0177990 | A1* | 11/2002 | Sample ............ 703/28 |
| 2002/0194581 | A1* | 12/2002 | Keener ............ 717/136 |
| 2003/0070070 | A1* | 4/2003 | Yeager et al. ............ 713/157 |
| 2003/0105620 | A1* | 6/2003 | Bowen ............ 703/22 |
| 2003/0115564 | A1* | 6/2003 | Chang et al. ............ 716/8 |
| 2004/0181385 | A1* | 9/2004 | Milne et al. ............ 703/14 |
| 2004/0236556 | A1* | 11/2004 | Lin ............ 703/14 |
| 2006/0117274 | A1* | 6/2006 | Tseng et al. ............ 716/1 |

OTHER PUBLICATIONS

U.S. Appl. No. 10/388,728, filed Mar. 14, 2003, Milne et al.

* cited by examiner

Primary Examiner—Paul Rodriguez
Assistant Examiner—Kandasamy Thangavelu
(74) Attorney, Agent, or Firm—LeRoy D. Maunu

(57) ABSTRACT

Method and apparatus for interfacing a high-level modeling system (HLMS) with a reconfigurable hardware platform for co-simulation. In one embodiment a boundary-scan interface is coupled to the HLMS and is configured to translate HLMS-issued commands to signals generally compliant with a boundary-scan protocol, and translate signals generally compliant with a boundary-scan protocol to data compatible with the HLMS. A translator and a wrapper are implemented for configuration of the hardware platform. The translator translates between signals that generally compliant with the boundary-scan protocol and signals that are compliant with a second protocol. A component to be co-simulated is instantiated within the wrapper, and the wrapper transfers signals between the translator and the component.

13 Claims, 4 Drawing Sheets

CO-SIMULATION VIA BOUNDARY SCAN INTERFACE

FIELD OF THE INVENTION

The present invention generally relates to simulating high-level models of electronic circuits.

BACKGROUND

A high level modeling system (HLMS) is a software tool in which electronic designs can be described, simulated, and translated by machine into a design realization. An HLMS provides a higher level of abstraction for describing and simulating an electronic circuit than does a hardware description language (HDL) simulation environment such as the ModelSim environment from the Model Technology company. An HLMS generally provides a mathematical representation of signals as compared to standard logic vectors in a hardware description language (HDL). It is desirable for the high-level abstractions to be precisely correlated with the ultimate implementation representation, both in simulation semantics and in implementation. The Xilinx System Generator tool for DSP and the MathWorks' Simulink and MATLAB environments are example HLMS's in which such capabilities are desirable.

In an HLMS-based design, there may be some components external to the HLMS environment that under certain circumstances, are desirable to have controlled by and involved in HLMS simulations. For example, it is sometimes useful to take existing HDL components that have been designed using a tool separate from the HLMS and incorporate the HDL components into an HLMS simulation environment. Furthermore, there may be existing hardware components that are desirable to involve in the HLMS simulation. The process of incorporating one or more external components into an HLMS-based simulation may be referred to as HLMS co-simulation.

A variety of different co-simulation engines are available for use in co-simulating part of a design. The particular co-simulation engine that is selected for use in the simulation depends on design objectives as well as the compatibility between the HLMS and various co-simulation engines.

Example co-simulation engines include both software-based and hardware-based systems. The Modelsim simulator and the NC-SIM simulator from Cadence are example software-based simulators, and the Wildcard development board from Annapolis Microsystems and the Benone development board from Nallatech are example hardware platforms that can be co-simulated in an HLMS environment. In software-based co-simulations the user may perform a behavioral simulation or perform simulation using a synthesized and mapped version of the design.

A hardware-based co-simulation engine based, for example, on a reconfigurable hardware platform that includes a field programmable gate array (FPGA), often includes a sophisticated interface for connecting and communicating with an off-board system that can control the hardware-based co-simulation engine. An example off-board system is a host PC running the simulation software. Example interfaces such as PCI, USB or Ethernet are often used. Even though these interfaces are common, a suitable logic core for implementing the interface on the device may be a burden to obtain and non-trivial to create from scratch. This may present a substantial barrier for a designer seeking to exploit the advantages of co-simulation.

SUMMARY OF THE INVENTION

The various embodiments of the invention provide methods and apparatus for interfacing a high-level modeling system (HLMS) with a reconfigurable hardware platform for co-simulation. In one embodiment a boundary-scan interface is coupled to the HLMS and is configured to translate HLMS-issued commands to signals generally compliant with a boundary-scan protocol, and translate signals generally compliant with a boundary-scan protocol to data compatible with the HLMS. A translator and a wrapper are implemented for configuration of the hardware platform. The translator translates between signals that are generally compliant with the boundary-scan protocol and signals that are compliant with a second protocol. A component to be co-simulated is instantiated within the wrapper, and the wrapper transfers signals between the translator and the component.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the invention permit the same interface to be used for co-simulation on a reconfigurable hardware platform that may be hosted on any of a variety of board-level configurations. This is accomplished in an example embodiment through use of an interface that generally functions according to the Joint Test Action Group (JTAG) "Standard Test Access Port Boundary-Scan Architecture" ("boundary scan" for brevity). The boundary-scan architecture generally defines a 5-pin serial protocol for accessing and controlling the signal-levels of pins of a digital circuit. The broad adoption of this protocol makes its use in co-simulation attractive on a variety of platforms.

Figure 1:
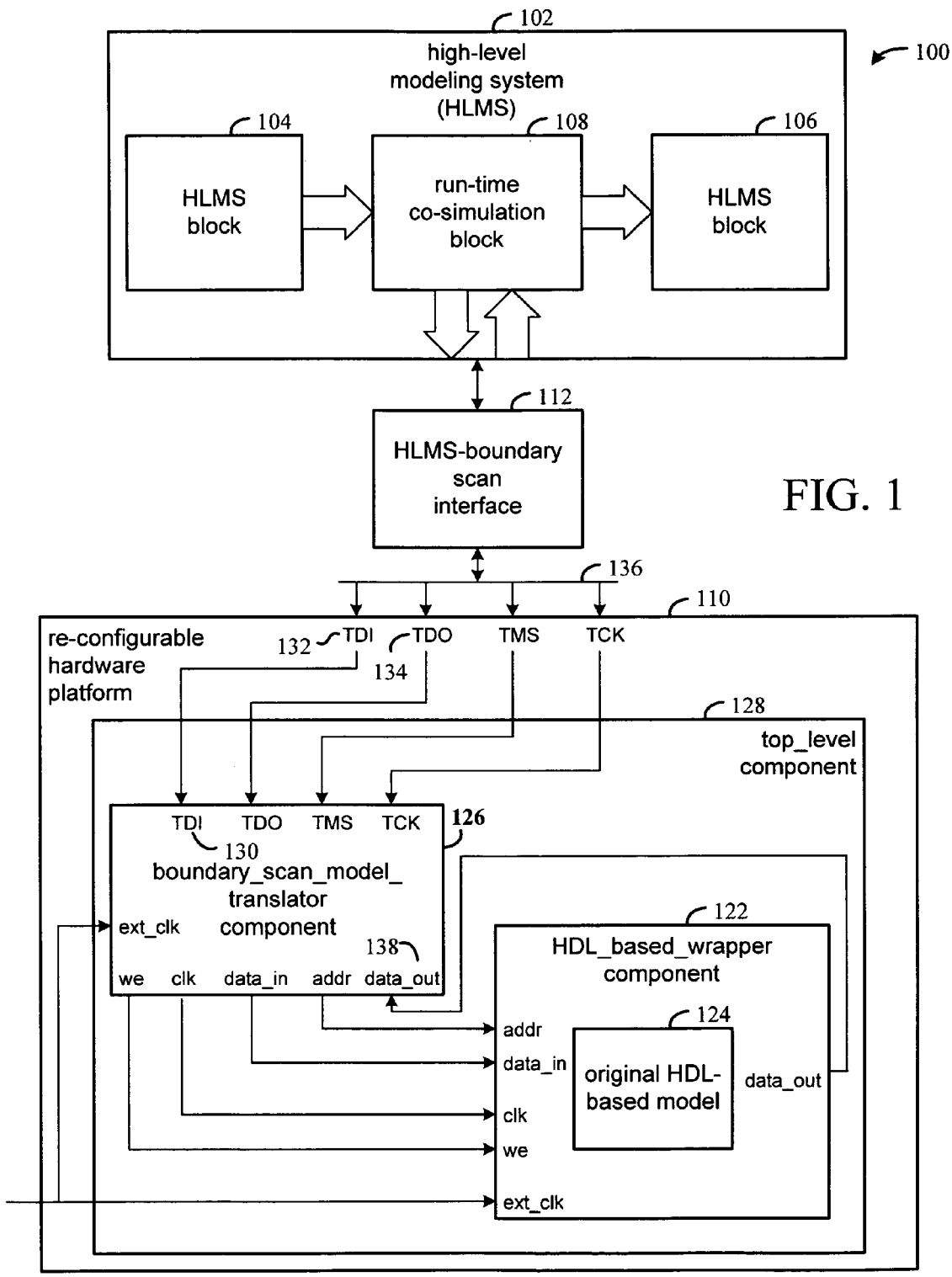
FIG. 1 is a functional block diagram of a system for co-simulating a model in accordance with various embodiments of the invention.

FIG. 1 is a functional block diagram of a system for co-simulating a model in accordance with various embodiments of the invention. The HLMS 102 hosts HLMS blocks 104 and 106 along with runtime co-simulation block 108. During co-simulation, output from HLMS block 104 is provided to co-simulation block 108, runtime co-simulation block 108 controls hardware platform 110 via function calls to HLMS-boundary-scan interface 112, and output from co-simulation block 108 is provided to HLMS block 106.

When a model is implemented for co-simulation on a reconfigurable hardware platform 110, an HDL-based wrapper component 122 is generated for the model. The component 122 implemented from the HDL-based wrapper provides the signals needed to control the behavior of the original HDL-based model 124 during co-simulation. The original HDL model is instantiated within the wrapper as a component, and the wrapper component 122 may include a memory map and decoding logic (e.g., address decode circuit 302 coupled to memory map circuit 304, having a plurality of registers, of FIG. 3B).

A block, which may be referred to as a compilation block, is included in the model and provides information about the target reconfigurable hardware platform. The compilation block also supplies the back-end scripting used to produce the wrapper and generate a configuration bit file that is suitable for the target hardware platform. Once the HLMS has finished translating the model into an HDL description, the HLMS invokes the back-end scripts that generate the wrapper (e.g., co-pending, commonly assigned patent application "Method and Apparatus for Providing an Interface to an Electronic Design of an Integrated Circuit," by Roger B. Milne, et. al., filed Mar. 14, 2003, Ser. No. 10/388,728, which is herein incorporated by reference). It will be appreciated that many platform vendors (e.g. Annapolis, Nallatech), have their own compilation blocks that are tailored for their particular hardware platforms.

The control signals exposed on the wrapper (addr, data_in, clk, we, ext_clk) are wired to appropriate ports on the memory map. Listing 1 below illustrates an example entity declaration for the HDL-based wrapper.

Listing 1:

```
component HDL_based_wrapper
port
(addr:     in   std_logic_vector (15 downto 0);
cik:       in   std_logic;
data_in:   in   std_logic_vector (31 downto 0);
data_out:  out  std_logic_vector (31 downto 0);
ext_clk:   in   std_logic;
we:        in   std_logic);
end component
```

It will be appreciated that the wrapper may also include the memory-map along with the original HDL-based model 124, which corresponds to an HLMS top-level entity such as co-simulation block 108, even though the HDL specification of these structures is not listed above.

A boundary_scan_model_translator component 126 is implemented as a separate HDL component that may be included in a top-level entity for a reconfigurable hardware platform 110. For example, boundary_scan model_translator component 126 is a sub-component of an example top_level component 128. In one embodiment, top_level component 128 is precompiled (e.g., synthesized) and may be provided as part of the overall interface. The top_level component in this embodiment is static, which means that it need not be generated when the model is translated into hardware. In a another embodiment, the top_level component is dynamic and may change it's port interface to support non-memory mapped signals that correspond to fixed resources on the reconfigurable platform such as LEDs, analog to digital converters, and external memories, depending on which components were used in the original HLMS model.

The boundary_scan_model_translator component 126 exposes ports that interface with the HDL_based_wrapper component 122. Listing 2 below illustrates an example declaration of the boundary_scan_model_translator component.

Listing 2:

```
entity boundary_scan_design_translator is
generic (addr_width : integer := 16;
data_width : integer := 12;
port(
addr : out
std_logic_vector(addr_width-1 downto 0);
data_in     : out
std_logic_vector(data_width-1 downto 0);
data_out    : in
std_logic_vector(data_width-1 downto 0);
clk         : out  std_logic;
we          : out     std_logic);
end boundary_scan_design_translator
```

In one embodiment, the boundary_scan_model_translator is also a precompiled, static component, which may be provided as part of the overall hardware platform interface.

The boundary_scan_model_translator component 126 drives the addr, data_in, and we ports that are used by the HDL_based_wrapper component 108. Similarly, component 126 accepts data from the HDL_based_wrapper component 122 on the data_out port 138. A write-enable strobe (we) and single step clock source (clk) are also generated for the HDL_based_wrapper 122 based on the address and write-enable strobe.

The boundary_scan_model_translator component 126 translates data that is received over the TDI port 130 via TDI pin 132 to the address and data_in signals that are used by the HDL_based_wrapper component 122. Data received on the data_out port 138 is transmitted off the reconfigurable hardware platform via TDO pin 134.

The boundary_scan_model_translator component 126 may be realized in hardware using a series of registers and multiplexers that connect to a boundary scan core suitable for the hardware platform 110.

The HLMS-boundary-scan interface 112 provides the interface between the HLMS 102 and reconfigurable hardware platform 110 via connector or cable 136. HLMS-boundary-scan interface 112 translates requests from the HLMS 102 to boundary scan format. Specific example functions include opening and closing a board, forcing input data on a port, extracting output data from a port, and controlling the clock signal input to the hardware platform. It will be appreciated that the HLMS-boundary scan interface may be implemented by adapting an existing program callable interface for controlling a hardware-level simulation via software. The adaptation makes the interface callable from the HLMS and translates requests and data between boundary scan and HLMS formats.

For example, the Parallel IV product from Xilinx may be used to connect the parallel port of a PC to the boundary scan pins of an FPGA. The software interface that allows PC-based software tools to interact with an FPGA via the Parallel IV product may be adapted to provide those same functions to an HLMS.

Figure 2:
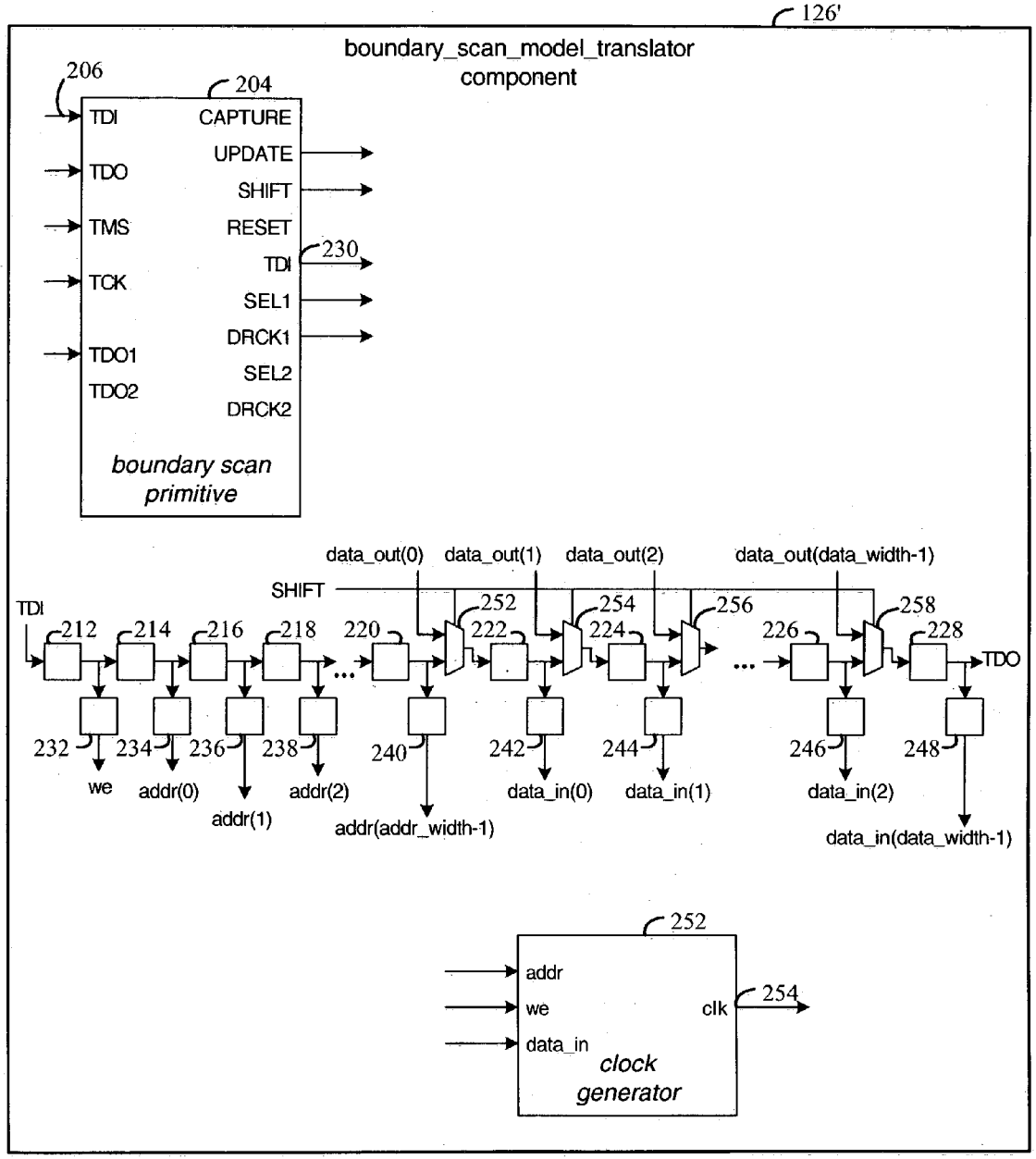
FIG. 2 shows an example embodiment of a boundary_scan_model translator component in which the input and output buffers share a single memory space.

FIG. 2 shows an example embodiment of a boundary_scan_model translator component 126' in which the input and output buffers share register chain in support of a single memory space.

Boundary scan primitive 204 receives input data received on the TDI port 206 of component 126', and input bits are shifted through registers 212, 214, 216, 218, . . . , 220, 222, 224, . . . , 226, and 228. The DRCK1 signal from boundary scan primitive 204 is coupled to the clock port of each of registers 212, 214, 216, 218, . . . , 220, 222, 224, . . . , 226, and 228. When an input set of bits is completely shifted in, the bits are staged to registers 232, 234, 236, 238, . . . , 240, 242, 244, . . . , 246, and 248. The SELL signal from boundary scan primitive 204 is connected to the clock enable port of each of registers 232, 234, 236, 238, . . . , 240, 242, 244, . . . , 246, and 248. The UPDATE signal from boundary scan primitive 204 is connected to the clock port of each of registers 232, 234, 236, 238, . . . , 240, 242, 244, . . . , 246, and 248.

Data output from wrapper component 122 is provided as input bits to registers 222, 224, . . . , 226, and 228 via associated multiplexers 252, 254, 256, . . . and 258. The multiplexers select between shifted bits and a set of output bits.

The clock generator 252 generates the clock signal on clk port 254 for input to the wrapper component 122. The we signal output from register 232 is coupled to the write-enable port of clock generator 252; the addr(x) bits from registers 234, 236, 238, . . . , 240 are input to the address input port of the clock generator; and the data_in(x) bits from registers 242, 244, . . . , 246, and 248 are input to the data_in port of the clock generator.

The addr and data_in bits are used by the clock generator to produce the single-step clock source for wrapper component 122. The clock generator has a particular address associated with it that lies outside of the memory-map address range. The HLMS can write to this address when it needs to advance the simulation time of the hardware platform 110 by stepping the clock source. The clock generator decodes the address value and latches the data_in value if the decoded address indicates that the input data is intended for the clock generator. The data value determines the number of clock pulses that will be produced. For example, if the HLMS needs to step the hardware platform by two clock cycles, the value two is applied on the data_in bus, and the appropriate clock address is applied on the addr bus. In response, the clock generator produces two clock pulses for wrapper component 122.

The Test Clock (TCK) input port on the boundary scan primitive receives clock signals synchronized to the data traveling on the TDO and TDI pins.

The Test Mode Select (TMS) port is used to navigate through states in a Test Access Port (TAP) controller. The software library in interface 112 contains methods that navigate these states automatically so that data can be shifted in and out of the boundary scan interface using simple function calls.

The example boundary scan primitive 204 provides two user scan chains, USER1 and USER2. In one embodiment, the USER1 chain is used. The USER2 chain may be used in an alternative embodiment. The Test Data Output port (TDO1) is used for the USER1 scan chain. The TDO1 and TDO2 are output signals driven by the USER1 and USER2 chains, respectively. The boundary scan primitive includes the logic that multiplexes these two signals into the TDO output signal.

The TDO2 and CAPTURE ports are not used in the example embodiment.

The RESET port receives the reset signal for the scan chain logic.

The SEL2 and DRCK2 ports receive signals for functionality that parallels the functionality of the SELL and DRCK1 signals, except these signals are asserted when the USER2 chain is active. It will be appreciated that the interface would function using the USER2 chain by rewiring signals DRCK1, SEL1, and TDO1 to DRCK2, SEL2, and TDO2, to the respective ports.

Figure 3A:
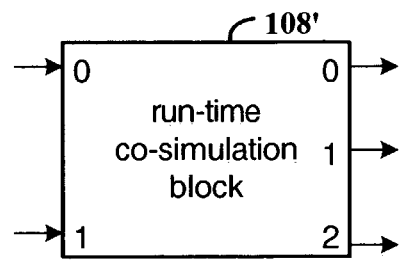
FIG. 3A illustrates an example run-time co-simulation block.
Figure 3B:
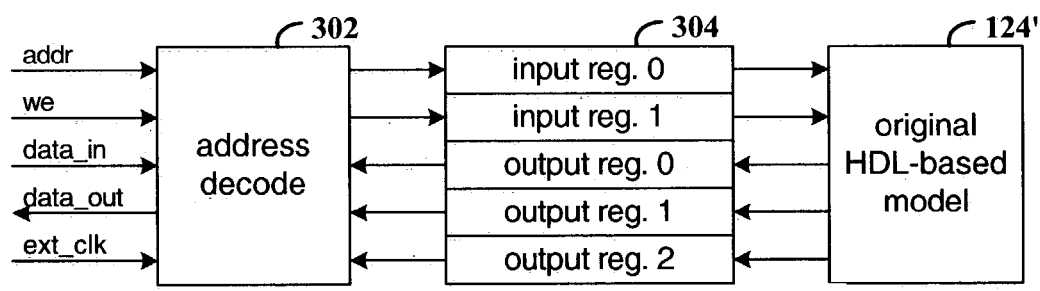
FIG. 3B illustrates an example memory map created for an example run-time co-simulation block.

FIG. 3A illustrates an example run-time co-simulation block 108' having 2 input ports 0 and 1, and 3 output ports 0, 1, and 2; and FIG. 3B illustrates an example memory map created for the HDL-based model 124'. Bits on input ports 0 and 1 are input the original HDL-based model 124' via the wrapper component 122, and bits on output ports 0, 1, and 2 are output from the original HDL-based model via 124' the wrapper component 122. The wrapper component 122 may include an address decode circuit 302 and a memory map circuit 304 having a plurality of registers, e.g., input reg. 0 to input reg. 2.

Memory map circuit 304 provides the interface through which input bits and output bits are exchanged between the translator component 126 and the HDL_based_wrapper component 122. Data that appears on input port 0 of the co-simulation block 108' is mapped to input register 0, and data that appears on input port 1 is mapped to input register 1. Similarly output data from the original HDL-based model 124' is output on ports 0, 1, and 2 of co-simulation block 108' via the mapped output registers 0, 1, and 2, respectively.

Address decode circuit 302 controls the writing of data to input registers 0 and 1 and the reading of data from output registers 0, 1, and 2 according to the input address bits from registers 234, 236, 238, . . . , and 240 (FIG. 2) and the we signal from register 232 (FIG. 2). The ext_clk signal is used where a free-running clock source is needed, as opposed to the single-step clock source. For example, the registers in the memory map 300 require a free-running clock source. Also, the free-running clock is used by translator component 126 in the derivation of the single-step clock source (clk). The input data is received from registers 242, 244, . . . , 246 and 248 (FIG. 2), and the output data is provided to multiplexers 252, 254, 256, . . . , and 258.

Figure 4:
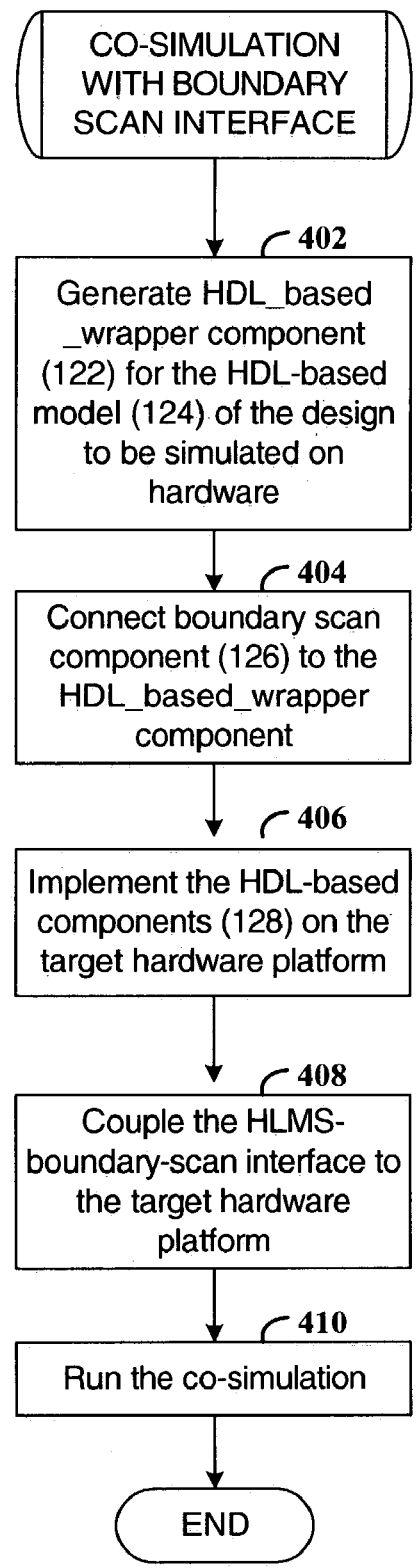
FIG. 4 is a flowchart of an example process for performing co-simulation using a boundary scan interface in accordance with various embodiments of the invention.

FIG. 4 is a flowchart of an example process for performing co-simulation using a boundary scan interface in accordance with various embodiments of the invention. The process creates an HDL_based_wrapper component (e.g., 122, FIG. 1) for the HDL-based model that is to be co-simulated on hardware (step 402). The wrapper may be created, in one embodiment, for example, using a compilation block that is associated with the HDL model.

The components that comprise boundary_scan_model_translator component 126 are connected to the wrapper component (step 404). The boundary_scan_model_translator component 126 exposes ports that interface with the HDL_based_wrapper component.

The HDL-based components of the top-level component 128 are then implemented on the target hardware platform (step 406). For example, conventional tools may be used to generate a configuration bitstream and load the bitstream on a re-configurable hardware platform such as an FPGA.

The HLMS-boundary-scan interface is coupled to the hardware platform (step 408) using, for example, a parallel-to-boundary scan cable and supporting software. The co-simulation may then be run (step 410).

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for co-simulation and has been found to be particularly applicable and beneficial in co-simulating high-level components and hardware-level components on an FPGA. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A co-simulation system for design verification of an electronic circuit, comprising:
    a high-level modeling system (HLMS);
    wherein the HLMS is a software tool executable on a computing arrangement;
    a boundary-scan interface coupled to the high-level modeling system and configured to translate HLMS-issued commands to signals compliant with a boundary-scan protocol;
    a re-configurable hardware platform coupled to the boundary-scan interface;
    a translator coupled to the boundary-scan interface, implemented on the re-configurable hardware platform, and configured to translate input signals compliant with the boundary-scan protocol to signals compliant with a second protocol;
    a first component instantiated within a wrapper component, wherein the wrapper component is coupled to the translator and is configured to transfer input signals of the second protocol to the first component; and
    a second component co-simulated by the HLMS in software while the first component is co-simulated on the reconfigurable hardware platform;
    wherein the HLMS-issued commands include at least one command that forces input co-simulation data from the second component to the first component, and/or at least one command that extracts output co-simulation data from the first component for input to the second component.

2. The system of claim 1, wherein the wrapper component further includes a memory map.

3. The system of claim 2, wherein the memory map includes a first set of registers for data input to the first component and a second set of registers for data output from the first component.

4. The system of claim 1, wherein the translator includes a shift register, input data is serially shifted into the register and output in parallel to the first component, and output data is input in parallel in the shift register and serially shifted out.

5. A system for interfacing a high-level modeling system (HLMS) with a hardware platform for co-simulation of a first component on the hardware platform for design verification of an electronic circuit, comprising:
    an interface coupled to the HLMS and configured to translate FILMS-issued commands to signals compliant with a boundary-scan protocol, and translate signals compliant with the boundary-scan protocol to data compatible with the HLMS;
    wherein the HLMS is a software tool executable on a computing arrangement;
    wherein the FILMS-issued commands include at least one command that forces input co-simulation data from a second component to the first component, andlor at least one command that extracts output co-simulation data from the first component for input to the second component;
    wherein the second component is co-simulated by the HLMS in software while the first component is co-simulated on a reconfigurable hardware platform;
    a translator coupled to the interface, implemented on the re-configurable hardware platform, and configured to translate input signals compliant with the boundary-scan protocol to signals compliant with a second protocol, and translate output signals compliant with the second protocol to signals compliant with the boundary-scan protocol; and
    a wrapper component implemented on the re-configurable hardware platform, the wrapper component coupled to the translator and being configured for instantiation of the first component within the wrapper component and configured to transfer input signals of the second protocol to the first component and transfer output signals of the second protocol to the translator.

6. The system of claim 5, wherein the wrapper component further includes a memory map circuit coupled to an address decoder circuit.

7. The system of claim 6, wherein the memory map circuit includes a first set of registers for data input to the first component and a second set of registers for data output from the first component.

8. The system of claim 5, wherein the translator includes a shift register, input data is serially shifted into the shift register and output in parallel to the first component, and output data is input in parallel in the register and serially shifted out.

9. A method for interfacing a high-level modeling system (HLMS) with a reconfigurable hardware platform for design verification of an electronic circuit, comprising:
    co-simulating a first component on the reconfigurable hardware platform in hardware while co-simulating a second component on the HLMS;
    wherein the HLMS is a software tool executable on a computing arrangement;
    coupling an interface to the HLMS, wherein the interface is configured to translate signals compliant with a boundary-scan protocol to data compatible with the HLMS;
    wherein the interface further translates HLMS-issued commands to signals compliant with the boundary-scan protocol, and the HLMS-issued commands include at least one command that forces input co-simulation data from the second component to the first component, and/or at least one command that extracts output co-simulation data from the first component for input to the second component;
    configuring the reconfigurable hardware platform with a translator and a wrapper component coupled to the translator; and
    coupling the translator to the interface, wherein the translator is configured to translate signals compliant with a second protocol to signals compliant with the boundary-scan protocol;
    wherein the wrapper component is configured for instantiation of the first component within the wrapper component and configured to transfer signals of the second protocol to the translator.

10. The method of claim 9, further comprising mapping data input to the first component and data output from the first component to an addressable memory space.

11. The method of claim 10, wherein the addressable memory space includes a first set of registers for data input to the first component and a second set of registers for data output from the first component.

12. The method of claim 9, further comprising serially shifting input data into a register and outputting in parallel data from the register to the first component, and storing output data from the first component in parallel in the register and serially shifting output data from the register to the boundary scan interface.

13. An apparatus for interfacing a high-level modeling system (HLMS) with a reconfigurable hardware platform for design verification of an electronic circuit, comprising:

means for co-simulating a first component on the reconfigurable hardware platform in hardware while co-simulating a second component on the HLMS;

wherein the HLMS is a software tool executable on a computing arrangement;

means for coupling a boundary-scan interface to the HLMS, wherein the boundary-scan interface is configured to translate HLMS-issued commands to signals compliant with a boundary-scan protocol, and translate signals compliant with the boundary-scan protocol to data compatible with the HLMS;

wherein the HLMS-issued commands include at least one command that forces input co-simulation data from the second component to the first component, and/or at least one command that extracts output co-simulation data from the first component for input to the second component;

means for configuring the reconfigurable hardware platform with a translator and a wrapper component coupled to the translator;

means for coupling the translator to the boundary-scan interface, wherein the translator is configured to translate input signals compliant with the boundary-scan protocol to signals compliant with a second protocol, and translate output signals compliant with the second protocol to signals compliant with the boundary-scan protocol; and means for configuring the wrapper component to instantiate the first component within the wrapper component, and means for transferring input signals of the second protocol to the first component and for transferring output signals of the second protocol to the translator.

* * * * *